US005814789A

United States Patent [19]

O'Leary et al.

[11] Patent Number: 5,814,789

[45] Date of Patent: Sep. 29, 1998

[54] FORCED CONVECTION FURNANCE GAS PLENUM

[75] Inventors: Brian O'Leary, Evanston, Ill.; David S. Harvey, Littleton, Mass.; Francis C. Nutter, Methuen, Mass.; Martin I. Soderlund, Westborough, Mass.

[73] Assignee: BTU International, Inc., North Billerica, Mass.

[21] Appl. No.: 685,243

[22] Filed: Jul. 18, 1996

[51] Int. Cl.[6] .......... H05K 3/34; F27B 9/10

[52] U.S. Cl. .......... 219/388; 219/400; 126/21 A

[58] Field of Search .......... 219/388, 400; 288/42, 179–180.21; 432/152; 126/21 A; 34/76, 77, 78

[56] References Cited

U.S. PATENT DOCUMENTS

| | | | |
|---|---|---|---|
| Re. 30,953 | 6/1982 | Vance et al. | 236/49 |
| 2,295,502 | 9/1942 | Lamb | 219/32 |
| 2,997,510 | 8/1961 | Geir, Jr. | 13/3 |
| 3,577,654 | 5/1971 | Marley | 34/231 |
| 3,628,441 | 12/1971 | Ardussi | 98/40 C |
| 3,815,670 | 6/1974 | Shriver | 165/55 |
| 3,818,815 | 6/1974 | Day | 98/40 D |
| 3,856,430 | 12/1974 | Langham | 415/207 |
| 3,974,859 | 8/1976 | McNabney | 137/625.37 |
| 4,023,355 | 5/1977 | McDonald | 60/254 |
| 4,164,642 | 8/1979 | Ebert | 392/432 |
| 4,175,936 | 11/1979 | Lough et al. | 55/385 A |
| 4,202,661 | 5/1980 | Lazaridis et al. | 432/8 |
| 4,207,686 | 6/1980 | Daily | 34/133 |
| 4,214,512 | 7/1980 | McCall | 98/40 D |
| 4,231,513 | 11/1980 | Vance et al. | 236/49 |
| 4,287,940 | 9/1981 | Corbett, Jr. | 165/48 R |
| 4,354,549 | 10/1982 | Smith | 165/62 |
| 4,373,702 | 2/1983 | Jayaraman et al. | 266/111 |
| 4,397,223 | 8/1983 | Maxson | 98/40 D |
| 4,426,918 | 1/1984 | Lambert | 98/40 D |
| 4,571,948 | 2/1986 | Orenstein | 60/641.8 |
| 4,591,333 | 5/1986 | Henke | 432/10 |
| 4,702,158 | 10/1987 | Ishihara | 99/323.5 |
| 4,876,437 | 10/1989 | Kondo | 219/388 |
| 4,909,236 | 3/1990 | Del Fabbro | 126/21 A |
| 4,909,430 | 3/1990 | Yokota | 228/180.2 |
| 4,987,290 | 1/1991 | Okuno | 392/375 |
| 5,054,208 | 10/1991 | Gillette et al. | 34/57 A |
| 5,056,586 | 10/1991 | Bemisderfer | 165/1 |
| 5,067,559 | 11/1991 | Perkinson | 165/112 |
| 5,069,380 | 12/1991 | Deambrosio | 228/42 |
| 5,099,685 | 3/1992 | McLean et al. | 73/147 |
| 5,111,641 | 5/1992 | Kadle | 62/515 |
| 5,116,197 | 5/1992 | Snell | 415/126 |
| 5,125,556 | 6/1992 | Deambrosio | 228/42 |
| 5,133,194 | 7/1992 | Army, Jr. et al. | 62/401 |
| 5,193,735 | 3/1993 | Knight | 228/42 |
| 5,205,784 | 4/1993 | DeHart et al. | 454/245 |
| 5,230,460 | 7/1993 | Deambrosio et al. | 228/180.1 |
| 5,230,654 | 7/1993 | Bloomer | 454/155 |
| 5,338,008 | 8/1994 | Okuno et al. | 432/152 |
| 5,345,923 | 9/1994 | Luebke et al. | 126/21 A |
| 5,347,103 | 9/1994 | LeMieux | 219/400 |

*Primary Examiner*—John A. Jeffrey
*Assistant Examiner*—J. Pelham
*Attorney, Agent, or Firm*—Weingarten, Schurgin, Gagnebin & Hayes LLP

[57] ABSTRACT

A forced convection furnace gas plenum having a mixing chamber to provide a heated gas of a more uniform temperature is presented. The plenum includes a heating element for heating gas and an orifice plate for metering the flow of heated gas to product within the furnace. A heater plate having larger apertures than those of the orifice plate is disposed between the heating element and the orifice plate. The apertures in the heater plate are sized to allow heated gas to pass therethrough into the mixing chamber, located between the heater plate and the orifice plate, with minimal pressure loss. The heated gas mixes in the mixing chamber, causing the temperature to become more uniform before the gas exits through the orifice plate to impinge on the product.

19 Claims, 2 Drawing Sheets

FORCED CONVECTION FURNANCE GAS PLENUM

FIELD OF THE INVENTION

The invention relates generally to forced convection reflow solder furnaces, and more particularly to hot gas plenums used in reflow solder furnaces.

BACKGROUND OF THE INVENTION

Convection furnaces are used for a variety of applications. One particularly useful application is the reflowing of solder in the surface mounting of electronic devices to circuit boards. In such furnaces, circuit boards, having had preformed solder previously deposited thereon, travel on a transport assembly through the furnace, and are brought into heat transfer proximity with at least one heating assembly. The heating assemblies are typically located above and below the transport assemblies and include heating elements therein to heat air or other gas. The heated gas is directed toward the product and thereby melts the solder once the solder is brought up to or above its reflow temperature. The heating assemblies typically include fans or other gas moving devices which circulate the gas over the heating elements and direct the gas to the circuit boards or other products.

An important consideration in reflow soldering is maintaining a uniform gas temperature across the product. Two factors play a part in maintaining the gas at a uniform temperature across the product—uniform heating of the gas and uniform gas flow across the product. Regarding uniform heating, heaters typically produce non-uniform heated gas; for example, an electrical heater produces inconsistent heat due to the successive voltage drops across the resistive elements of the heater.

An additional important consideration in reflow soldering is maintaining a uniform gas flow across the product. One or more fans provide a flow of gas across coils of the heating assembly. The fans however do not provide uniform flow rates. The fan typically has a series of blades connected to a central hub. As the blades rotate, they move the gas. As a result, the flow of gas provided by the blades of the fan has a wake at the central hub, since there is no provision for moving the gas at the central hub. Accordingly, the flow provided by the fan has non-uniform flow rates associated with it.

Another furnace design uses a gas amplifier in the top of a sealed, pressurizable box. The gas amplifier introduces a high volume flow of air or other gas into the box. The flow circulates over heating elements to heat the gas, which pressurizes the interior of the box. The heated gas is distributed over a plate having an array of orifices and flows through the orifices to impinge on the product on the conveyor. The gas is recirculated through a return plenum. The gas amplifier may also have non-uniform flow rates associated with it since the small gap communicating annularly around the amplifier body may be of inconsistent width or may be clogged by small particles at different places around the body, thus interfering with the compressed gas flow around the inside perimeter of the body of the gas amplifier.

SUMMARY OF THE INVENTION

A solder reflow forced convection furnace gas plenum includes a mixing chamber which provides a heated gas of a more uniform temperature. The plenum includes a heating element for heating gas and an orifice plate for metering the flow of heated gas to product within the furnace. A heater plate having larger apertures than those of the orifice plate is disposed between the heating element and the orifice plate. The mixing chamber is provided within the gas plenum between the heater plate and an orifice plate. The apertures in the heater plate are sized to allow heated gas to pass therethrough into the mixing chamber with minimal pressure loss. As the heated gas circulates within the mixing chamber it becomes more uniform in temperature. The heated gas exits the mixing chamber through metering holes in the orifice plate. Accordingly, the heated gas exiting the mixing chamber is of more uniform temperature which thereby provides for a more reliable and consistent soldering process. Existing plenums can be retrofitted with a heater plate, thereby incorporating a mixing chamber to provide a more uniform temperature.

BRIEF DESCRIPTION OF THE DRAWINGS

The invention will be more fully understood from the following detailed description taken in conjunction with the accompanying drawings in which.

DETAILED DESCRIPTION

Figure 1:
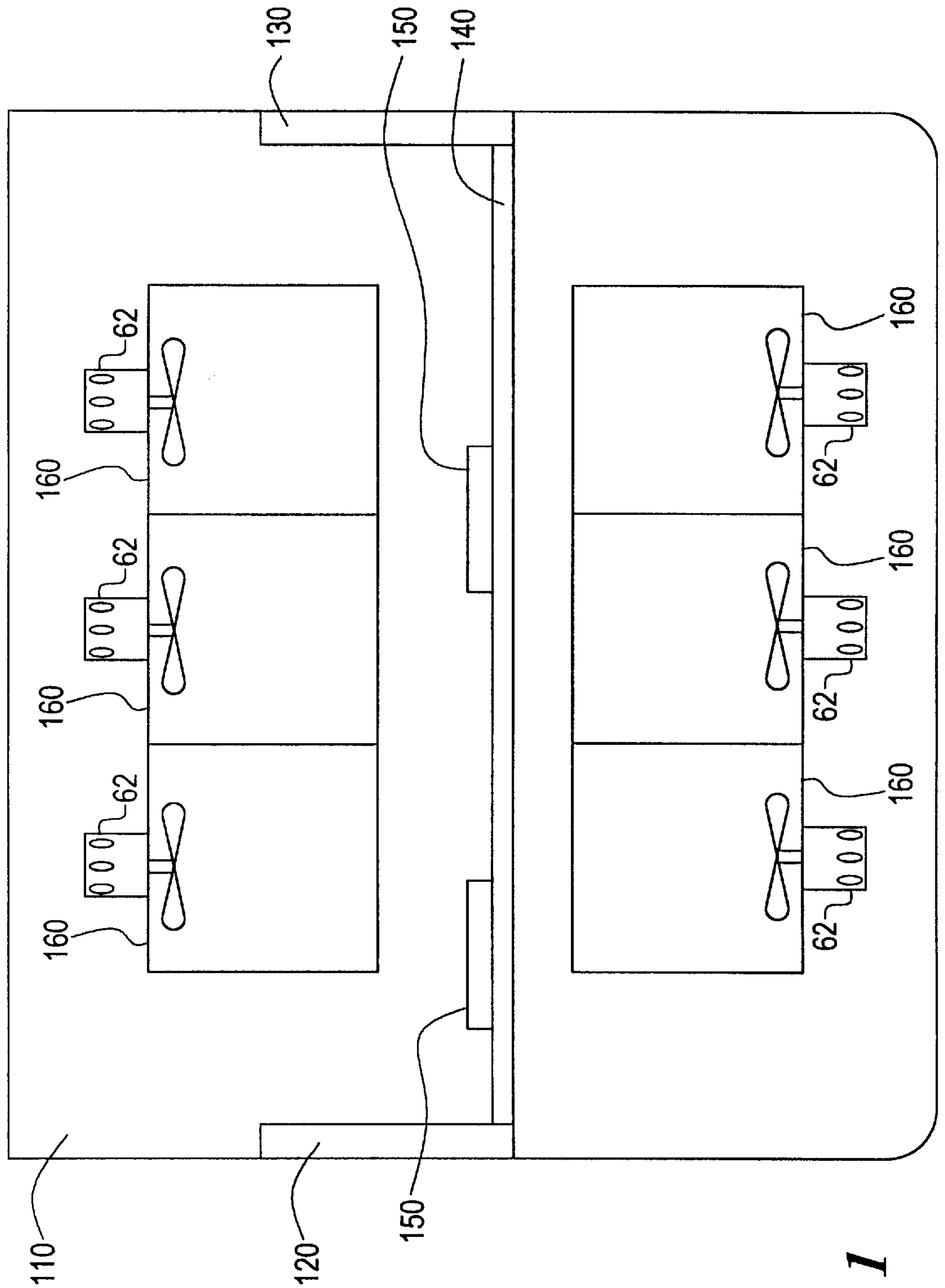
FIG. 1 is a schematic illustration of a solder reflow furnace incorporating the hot gas plenum of the present invention.

FIG. 1 shows a solder reflow forced convection furnace 110. Three gas plenums 160, according to the present invention, described more fully below, are disposed abutting each other above a conveyor or transport assembly 140. Also shown are three gas plenums 160 disposed below the transport assembly 140. Although three plenums are illustrated above and three below the transport assembly, any number and arrangement can be provided, as would be known by one of ordinary skill in the art. The gas plenums incorporate a heating assembly to heat gas within the furnace and direct the heated gas to a product 150, such as a circuit board.

The product 150 is placed into the furnace 110 and is transported by the transport assembly 140. The transport assembly 140 could be a conveyor belt, rollers, a walking beam or other known transport. The product is introduced into the furnace at furnace inlet 120, and removed from the furnace at furnace outlet 10. The transport assembly 140 transports the product 150 into heat transfer proximity with the gas provided by gas plenums 160. Alternatively, the furnace does not include a transport assembly. The product 150 is placed into the furnace, where it remains stationary. The product 150 is reflow soldered, cooled, then removed from the furnace.

Figure 2:
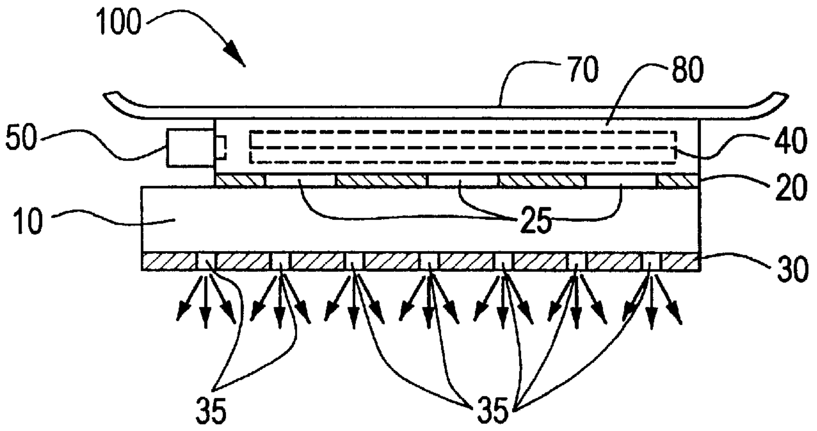
FIG. 2 is a schematic illustration of a gas plenum having a mixing chamber in conjunction with a gas amplifier according to the present invention.

Referring to FIG. 2 a gas plenum 100 according to the present invention has a plenum housing 70 defining a heating chamber 80 and a mixing chamber 10 separated by a heater plate 20. Heating chamber 80 includes one or more heating elements 40 mounted within the heating chamber in any suitable manner. In this embodiment the heating elements are electrical resistance elements, though other embodiments could use other types of heating elements such as IR heaters or gas burners.

A gas amplifier 50 provides for a high volume flow of gas into the gas plenum 100. For example, a typical flow rate in a solder reflow furnace is approximately 60 liters per minute. Typically the gas is air or $N_2$. Gas amplifier 50 comprises a tubular body, open on each of two ends and having a passage extending therethrough. The gas amplifier additionally has a compressed gas input (not shown) that communicates annularly around one end of the tubular body through a small gap (typically 0.001 to 0.003 inch). As the compressed gas flows through the annular gap and around the inside perimeter of the tubular body, ambient gas is entrained through the gas amplifier, resulting in a high flow of gas as it exits the gas amplifier. The gas exiting the air amplifier however, may have a non-uniform flow rate since the small gap communicating annularly around the amplifier body may be of inconsistent width or may be clogged by small particles at different places around the body, thus interfering with the compressed gas flow around the inside perimeter of the body.

Once the gas has entered the heating chamber 80 it flows across the heater elements 40, and is heated to between approximately 150° C.–250° C. Heater elements 40 typically produce non-uniform heated gas; for example, an electrical resistance heater produces inconsistent heat due to the successive voltage drops across the elements of the heater.

The heated gas then passes through apertures 25 in the heater plate 20 into the mixing chamber 10. The apertures 25 have a total area larger than the total area of metering holes 35 in an orifice plate 30 (described below). The larger area of these apertures 25 allows the heated gas to pass through the heater plate 20 and into the mixing chamber 10 with a minimal loss of pressure within the mixing chamber 10.

Mixing chamber 10 has the heater plate 20 as a top side, an orifice plate 30 as a bottom side and the plenum housing 70 forming the remaining sides. The mixing chamber 10 allows the non-uniform temperature gas to circulate and mix therein, resulting in a more uniform temperature gas. Preferably, the volume of the mixing chamber 10 is selected to be large enough to provide sufficient mixing of the gas, such that the temperature differential of the heated gas exiting the plenum 100 is approximately ±2° C. Additionally, the mixing in the mixing chamber 10 obviates the need to rely on the gas amplifier 50 to deliver a uniform flow. Also, the volume of the mixing chamber 10 in combination with the volume of the heating chamber 80, flow-rate in and total area of the metering holes 35 are chosen to achieve a desired pressure and velocity as well as flow overlaps between holes based on their distance from the product being reflow soldered. These factors are critical to the quality and effectiveness of the reflow solder process.

The bottom side of the mixing chamber comprises the orifice plate 30. The orifice plate 30 has a number of metering holes 35 which allow for delivery of the more uniform temperature gas to a product 150 which has been brought into heat transfer proximity with the heated gas.

Figure 3:
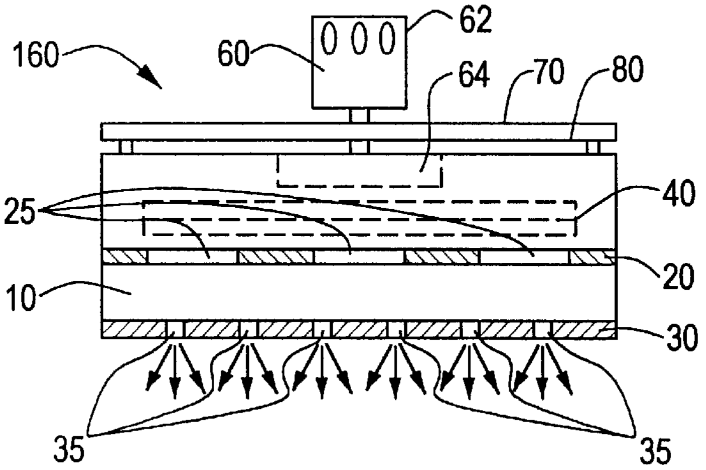
FIG. 3 is a schematic illustration of a gas plenum having a mixing chamber in conjunction with a blower according to the present invention.

FIG. 3 shows an alternate embodiment in which the gas amplifier 50 (as shown in FIG. 2) has been replaced with a blower assembly 60. The blower assembly 60 is comprised of an electric motor 62 and a blower wheel 64 which provide a flow of gas into the heating chamber 80. The blower assembly 60 however does not provide uniform flow rates.

The blower wheel 64 typically has a number of blades connected to a central hub, which is rotatable. As the blower wheel 64 rotates, the blades move the air. As a result, the flow provided by the blower wheel 64 has a wake at the central hub, since there is no provision for moving the air at the central hub. Accordingly, the flow provided by blower assembly 60 has non-uniform flow rates associated with it.

The gas flow provided by the blower assembly 60 is presented to heater element 40. Heater element 40 heats the gas provided by blower assembly 60; however the heated gas may not be uniform in temperature across the heater, as described above in relation to FIG. 2.

Mixing chamber 10 has the heater plate 20 as a top side, an orifice plate 30 as a bottom side and the plenum housing 70 forming the remaining sides. The mixing chamber 10 allows the non-uniform temperature gas to circulate and mix therein, resulting in a more uniform temperature gas. Preferably, as discussed above, the volume of the mixing chamber 10 is selected to be large enough to provide sufficient mixing of the gas, such that the temperature differential of the heated gas exiting the plenum 160 is approximately ±2° C. Additionally, the mixing in the mixing chamber 10 obviates the need to rely on the blower assembly 60 to deliver a uniform flow. Also, the volume of the mixing chamber 10 in combination with the volume of the heating chamber 80, flow-rate in and total area of the metering holes 35 are chosen to achieve a desired pressure upon exiting the gas plenum 160.

Figure 4:
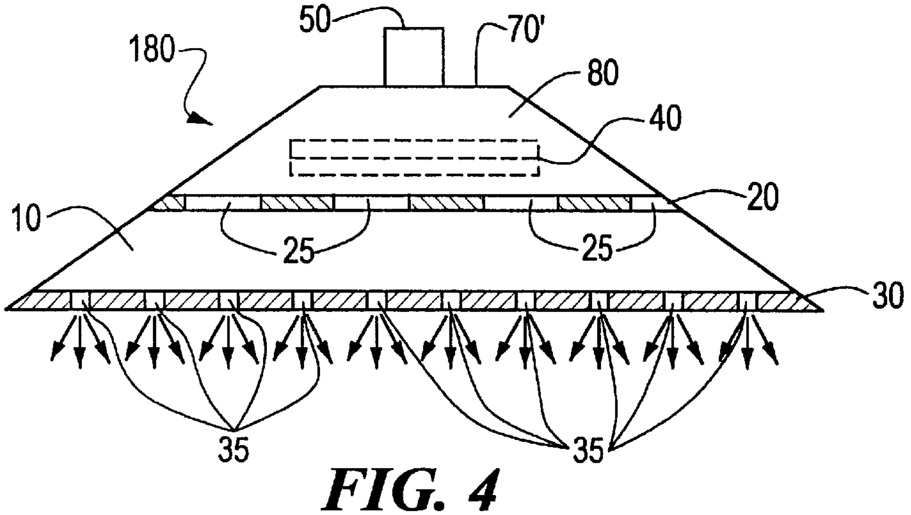
FIG. 4 is a schematic illustration of a hot gas plenum that has been retrofitted to include a mixing chamber according to the present invention.

Pre-existing gas plenums can be retrofitted to incorporate the mixing chamber of the present invention. FIG. 4 shows a preexisting gas plenum 180 employing a gas amplifier 50. A preexisting deflector plate (not shown) has been removed. The existing heating element 40 is used, but it is relocated to a vertically higher position within the plenum 180 or to a position nearer the gas amplifier 50. The heater plate 20 is fastened to an inside surface of gas plenum housing 70'. The heater plate 20 is installed below the relocated heating element 40 and above the orifice plate 30 to create the mixing chamber 10 therebetween. In this manner existing plenums 180 can be easily retrofitted to include the mixing chamber and therefore provide more uniform temperature gas with minimal pressure loss.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

We claim:

1. A gas plenum for a forced convection furnace comprising:

a housing;

a gas supply communicating with and providing gas to said housing;

an orifice plate forming at least a portion of a surface of said housing, said orifice plate having a plurality of metering holes;

a heating plate disposed within said housing above said orifice plate, said heating plate having a plurality of apertures, said heating plate and a first portion of said housing defining a heating chamber;

a mixing chamber formed by said heating plate, said orifice plate and a second portion of said housing; and at least one heating element disposed within said heating chamber.

2. A gas plenum disposed within a forced convection furnace housing comprising:

an inlet for receiving gas to be heated;

a heating chamber having a heating element mounted therein;

a mixing chamber downstream of said heating chamber for mixing gas heated by said heating element to reduce temperature variations within the heated gas;

and an outlet disposed to direct the heated gas to a product area.

3. The gas plenum of claim 1 wherein said gas supply comprises a gas amplifier.

4. The gas plenum of claim 1 wherein said gas supply comprises a blower.

5. The gas plenum of claim 1 wherein said apertures of said heating plate are sized to minimize pressure drop within said heating chamber.

6. The gas plenum of claim 1 wherein said mixing chamber has a volume preselected to provide uniform temperature gas.

7. The gas plenum of claim 1 wherein the gas comprises air.

8. The gas plenum of claim 1 wherein the gas comprises $N_2$.

9. The gas plenum of claim 1 wherein said gas supply provides a flow rate of approximately 60 liters per minute of gas to said heater.

10. The gas plenum of claim 1 wherein said heater provides gas at a temperature of approximately 150°–250° C. to said heater plate.

11. The gas plenum of claim 1 wherein said mixing chamber has a volume preselected to provide a uniform temperature gas within ±2° C. across the output of said gas plenum.

12. A forced convection furnace comprising:

a furnace housing;

an opening in said furnace housing for moving product therethrough;

a product area for receiving product to be heated; and a gas plenum, said gas plenum disposed within said furnace housing, said gas plenum including an inlet for receiving gas to be heated, a heating chamber having a heating element mounted therein, a mixing chamber downstream of said heating chamber for mixing gas heated by said heating element to reduce temperature variations within the heated gas, and an outlet disposed to direct the heated gas to said product area.

13. The forced convection furnace of claim 12 further comprising:

a further opening in said furnace housing for moving product therethrough; and a transport assembly disposed within said furnace housing from said opening to said further opening for transporting product through said product area.

14. The forced convection furnace of claim 12 wherein said mixing chamber of said gas plenum further includes an orifice plate at a bottom side, said orifice plate including a plurality of metering holes.

15. The forced convection furnace of claim 12 wherein said mixing chamber of said gas plenum has a volume preselected to provide uniform temperature gas.

16. The forced convection furnace of claim 12 wherein said mixing chamber of said gas plenum has a volume preselected to provide a uniform temperature gas within ±2° C. across the output of said plenum.

17. The furnace of claim 13 wherein said furnace is a solder reflow furnace.

18. The forced convection furnace of claim 12 wherein said gas plenum further comprises a heating plate having a plurality of apertures, said heating plate disposed between said heating chamber and said mixing chamber.

19. The forced convection furnace of claim 18 wherein said apertures of said heating plate of said gas plenum are sized to minimize pressure drop within said heating chamber.

* * * * *